(12) United States Patent
Shikata

(10) Patent No.: US 8,076,981 B2
(45) Date of Patent: Dec. 13, 2011

(54) SELF-CALIBRATING OSCILLATOR

(75) Inventor: Eji Shikata, Sendai (JP)

(73) Assignee: Freescale Semiconductor, Inc., Austin, TX (US)

( * ) Notice: Subject to any disclaimer, the term of this patent is extended or adjusted under 35 U.S.C. 154(b) by 133 days.

(21) Appl. No.: 12/750,723

(22) Filed: Mar. 31, 2010

(65) Prior Publication Data

US 2010/0271139 A1 Oct. 28, 2010

(30) Foreign Application Priority Data

Apr. 22, 2009 (JP) ................................. 2009-104479

(51) Int. Cl.
*H03K 3/26* (2006.01)

(52) U.S. Cl. ........ 331/111; 331/143; 331/135; 331/173; 331/185; 327/72; 327/73; 327/143

(58) Field of Classification Search .................. 331/111, 331/135, 143, 173, 185; 327/72, 73, 143
See application file for complete search history.

(56) References Cited

U.S. PATENT DOCUMENTS

| 5,594,388 | A | 1/1997 | O'Shaughnessy |
| 6,114,920 | A | 9/2000 | Moon |
| 7,009,429 | B2 * | 3/2006 | Eberlein ........................ 327/72 |
| 7,126,433 | B2 | 10/2006 | Godambe |
| 7,372,342 | B2 | 5/2008 | Berens |
| 2004/0133912 | A1 | 7/2004 | Thomas |

* cited by examiner

*Primary Examiner* — Arnold Kinkead
(74) *Attorney, Agent, or Firm* — Charles Berqere

(57) ABSTRACT

An oscillator that increases the accuracy of an output frequency, without using a charge pump, has an oscillation circuit, first and second voltage supply circuits, and a calibration value generation circuit. The first voltage supply circuit includes a resistor and a capacitor, the resistance and capacitance of which are determined so that a first voltage reaches a reference voltage within a reference time. The second voltage supply circuit includes first and second switching means, which perform switching when receiving pulse signals corresponding to the frequency of the oscillation circuit to raise the second voltage. A calibration value generation circuit provides the oscillation circuit with a calibration value that lowers the frequency when the second voltage reaches the reference voltage before the first voltage and raises the frequency when the second voltage reaches the reference voltage after the first voltage.

5 Claims, 5 Drawing Sheets

SELF-CALIBRATING OSCILLATOR

BACKGROUND OF THE INVENTION

The present invention relates to a self-calibrating oscillator for calibrating the frequency of an output signal.

RC oscillators are widely used in semiconductor products. This is because an RC oscillator is an inexpensive clock source and allows for the generation of various frequencies by changing resistance and the capacitance. However, the circuits of the oscillator produce a delay that affects the oscillation frequency. The time of such delay is determined in accordance with the power supply voltage, the environmental temperature, the manufacturing process, and other factors. Thus, for practical use, the RC oscillator is limited to low frequency and low accuracy applications.

Accordingly, an RC oscillator that oscillates with high accuracy has been developed (for example, refer to U.S. Pat. No. 5,594,388, page 1). U.S. Pat. No. 5,594,388 describes an oscillator including a resistor and capacitor and has a time constant determined by the resistance and capacitance. Prior oscillators used RC circuits for frequency generation. However, the oscillator of U.S. Pat. No. 5,594,388 does not use an RC circuit. Rather, this oscillator compares the RC time constant with a period obtained from a frequency generated by another oscillation circuit. Then, the oscillator self-calibrates the frequency of the entire RC oscillation circuit in accordance with the comparison result.

The oscillator described in U.S. Pat. No. 5,594,388, however, needs a charge pump to generate a voltage signal that calibrates the oscillation frequency. In addition, the oscillator is continuously self-calibrating the frequency, which consumes a lot of power.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

The present invention provides a self-calibrating oscillator that efficiently increases the accuracy of the output frequency.

One aspect of the present invention is a self-calibrating oscillator including an oscillation circuit that outputs a frequency corresponding to a calibration value. A first voltage supply circuit outputs a first voltage, which is monotonously changed in accordance with a predetermined time constant. A second voltage supply circuit outputs a second voltage, which is changed by a switching operation corresponding to a frequency of an output signal from the oscillation circuit. A calibration value generation circuit provides the oscillation circuit with a calibration value corresponding to a difference between a time in which the second voltage reaches a reference voltage from a change initiation time and a reference time in which the first voltage reaches the reference voltage from the change initiation time.

Other aspects and advantages of the present invention will become apparent from the following description, taken in conjunction with the accompanying drawings, illustrating by way of example the principles of the invention.

First Embodiment

An oscillator 10 according to a first embodiment of the present invention will now be discussed with reference to FIGS. 1 to 3.

Figure 1:
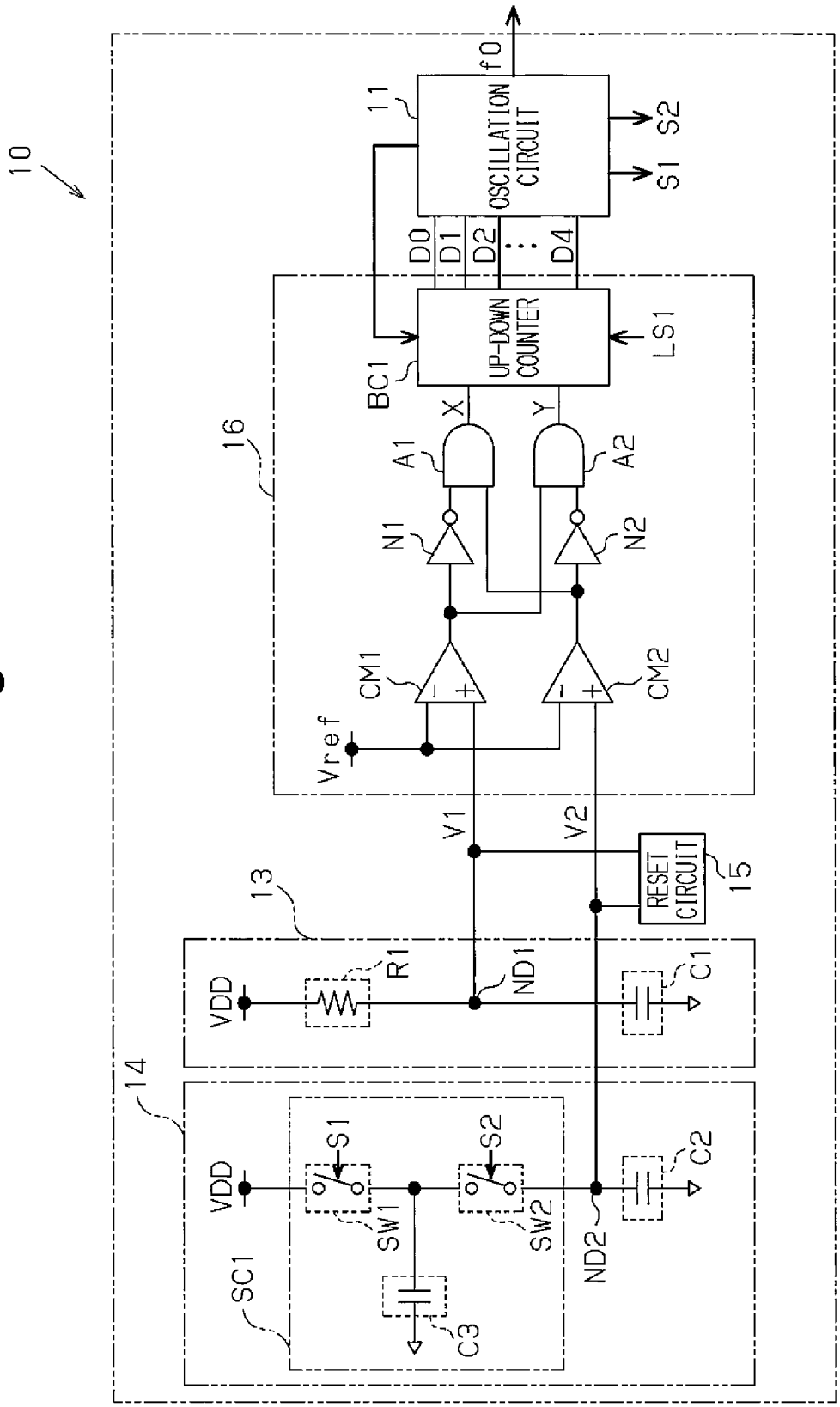
FIG. 1 is a schematic circuit diagram of a self-calibrating oscillator according to a first embodiment of the present invention.

As shown in FIG. 1, the oscillator 10 of the present embodiment includes an oscillation circuit 11, a first voltage supply circuit 13, a second voltage supply circuit 14, a reset circuit 15, and a calibration value generation circuit 16. When calibrating a frequency f0 of the oscillation circuit 11, the oscillator 10 repeatedly undergoes a cycle including a charge period and a load/reset period until a calibration period elapses. The oscillator 10 outputs the frequency f0 of when the predetermined calibration period has elapsed as the calibrated frequency.

The oscillator 10 includes a timing control unit (not shown). When obtaining a calibration initiation signal from an external device, the timing control unit outputs a signal that starts the charge period and the load/reset period. Specifically, when entering the charge period (change initiation time), the timing control unit provides the second voltage supply circuit 14 with pulse signals S1 and S2, which are in correspondence with the frequency of the oscillation circuit 11, to charge capacitors C2 and C3, which will be described later, in the second voltage supply circuit 14. Then, when entering the load/reset period as the charge period ends, the timing control unit provides an up-down counter BC1 with a load signal LS1. After a second predetermined time elapses from when the load signal LS1 is output, the timing control unit provides the reset circuit 15 with a reset signal. Then, after a predetermined reset period ends from when the reset signal is output, the timing control unit restarts the charge period. The timing control unit stores a calibration period to end the calibration of the frequency f0 and repeatedly performs the output of the load signal LS1 and the reset signal until the calibration period elapses.

[Oscillation Circuit 11]

The oscillation circuit 11 shown in FIG. 1 is formed by a known voltage-controlled oscillation circuit and outputs an output signal having the frequency f0. The oscillation circuit 11 is connected to the calibration value generation circuit 16 by a plurality of data lines. The oscillation circuit 11 acquires calibration data through the data lines and calibrates the frequency f0 of the output signal in accordance with a calibration value represented by the calibration data. In the present embodiment, the data signals D0, D1, D2, D3, and D4 allows for the oscillation circuit 11 to acquire the calibration value in "32" stages. The oscillation circuit 11 of the present embodiment decreases the frequency f0 of the output signal when an increased calibration value is acquired. Further, the oscillation circuit 11 increases the frequency f0 of the output signal when a decreased calibration value is acquired. Further, the pulse signals S1 and S2, which correspond to the output signal of the oscillation circuit 11, are provided to the second voltage supply circuit 14. The pulse signals S1 and S2 are signals that repeat a high level or a low level in synchronization with the frequency of the output signal. The pulse signal S1 is an inverted signal of the pulse signal S2. Specifically, the pulse signal S1 has a low level when the pulse signal S2 has a high level, and the pulse signal S1 has a high level when the pulse signal S2 has a low level.

[First Voltage Supply Circuit 13]

The first voltage supply circuit 13 includes a resistor R1 and a capacitor C1, which are connected in series. The resistor R1 is connected to a high potential line, and the capacitor C1 is connected to a low potential line. Power supply voltage VDD having a high potential is applied to the high potential line, and power supply voltage having a low potential is applied to the low potential line. In the present embodiment, a first node ND1 connecting the resistor R1 and the capacitor C1 serves as a first connection node. The voltage at the first node ND1 serves as a first voltage V1.

The resistance of the resistor R1 and the capacitance of the capacitor C1 are set to obtain a time constant that allows for the first voltage V1 to reach a reference voltage Vref in a predetermined reference time t1. The reference time t1 is a target time for a second voltage V2, which is generated by the second voltage supply circuit 14, to reach the reference voltage Vref when the calibrated frequency f0 is output.

[Second Voltage Supply Circuit 14]

The second voltage supply circuit 14 includes a switched capacitor circuit SC1 and a capacitor C2, which are connected in series. The switched capacitor circuit SC1 is connected to the high potential line, and the capacitor C2 is connected to the low potential line. The switched capacitor circuit SC1 functions as a circuit that is equivalent to a resistor supplying a predetermined current to the capacitor C2. A second node ND2 connecting the switched capacitor circuit SC1 and the capacitor C2 serves as a second connection zone. The voltage at the second node ND2 serves as a second voltage V2. In the present embodiment, the capacitance of the capacitor C2 is set to a value that is the same as the capacitance of the capacitor C1 in the first voltage supply circuit 13.

The switched capacitor circuit SC1 includes a first switching means SW1 connected to the high potential line, a second switching means SW2 connected to the first switching means SW1 and the capacitor C2, and a capacitor C3 connected to a connection node of the first and second switching means SW1 and SW2. The capacitor C3 is connected to the low potential line in parallel to the second switching means SW2 and the capacitor C2.

The first switching means SW1 connects the high potential line and the capacitor C3 when the pulse signal S1 has a high level. Further, the first switching means SW1 disconnects the high potential line and the capacitor C3 when the pulse signal S1 has a low level.

The second switching means SW2 connects the capacitor C3 and the capacitor C2 when the pulse signal S2 has a high level. Further, the second switching means SW2 disconnects the capacitor C3 and the capacitor C2 when the pulse signal S2 has a low level. Accordingly, the capacitor C3 is charged by the high potential power supply voltage VDD when the pulse signal S1 has a high level and the pulse signal S2 has a low level. Further, the capacitor C2 is charged by the charged capacitor C3 when the pulse signal S1 has a low level and the pulse signal S2 has a high level. The connection and disconnection of the first and second switching means SW1 and SW2 are repeated to gradually charge the capacitor C2 and gradually raise the second voltage V2.

Figure 2A:
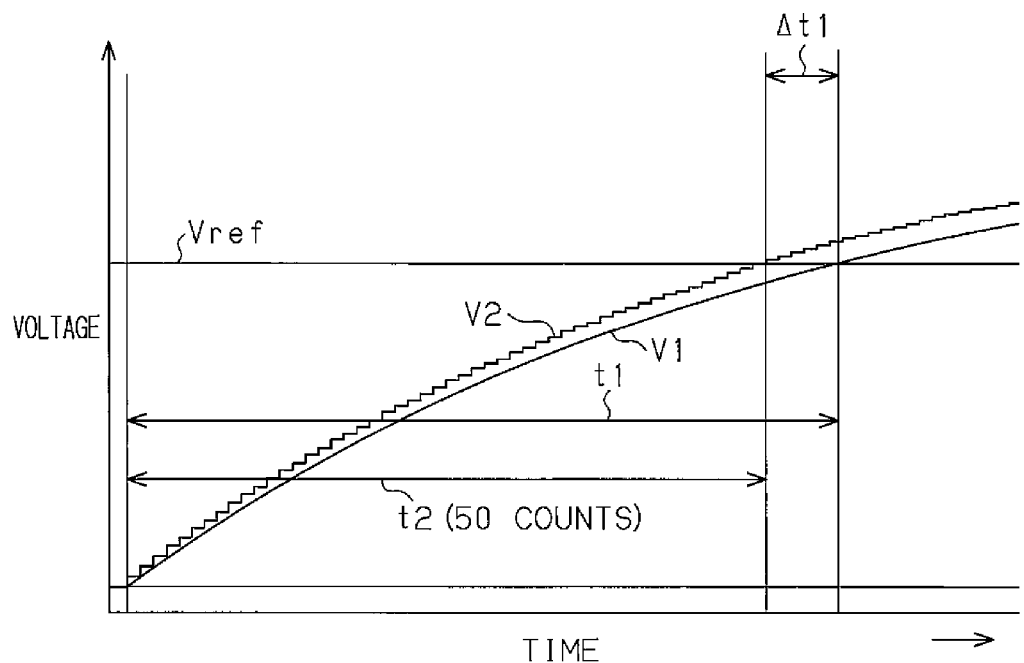
FIG. 2A is a graph showing the relationship of first and second voltages when the second voltage reaches a reference value before the first voltage, of the circuit shown in FIG. 1.
Figure 3A:
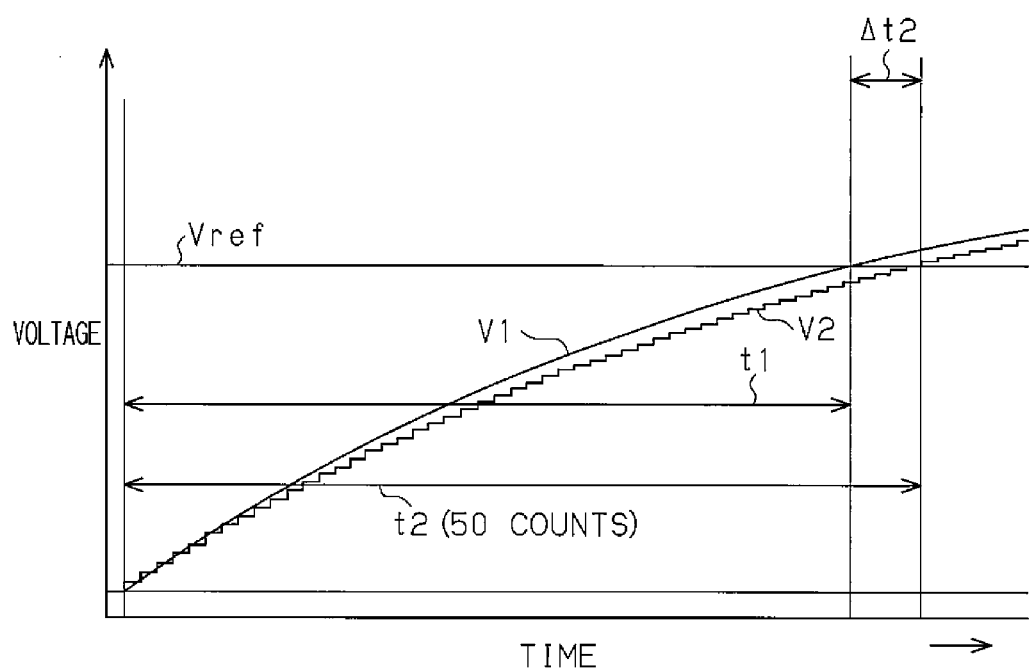
FIG. 3A is a graph showing the relationship of the first and second voltages when the first voltage reaches the reference value before the second voltage, of the circuit shown in FIG. 1.

In the present embodiment, the capacitors C2 and C3 of the second voltage supply circuit 14 are set so that the second voltage V2 reaches the reference voltage Vref when the pulse signals S1 and S2 are provided a predetermined number of times (50 counts as shown in FIGS. 2A and 3A).

[Reset Circuit 15]

The reset circuit 15 is connected to the first node ND1 of the first voltage supply circuit 13 and the second node ND2 of the second voltage supply circuit 14. The reset circuit 15 discharges the capacitors C1 and C2 in response to the reset signal and resets the first voltage V1 and the second voltage V2 to the voltage at the low potential line (initial value). Specifically, when acquiring the reset signal from the timing control unit, the reset circuit 15 connects the first node ND1 and the second node ND2 to the low potential line to reset the first voltage V1 and the second voltage V2 to the voltage of the initial value. The reset circuit 15 stops discharging the capacitors C2 and C3 when the reset period corresponding to the reset signal ends.

[Calibration Value Generation Circuit 16]

The calibration value generation circuit 16 of the present embodiment provides the oscillation circuit 11 via the data signals D0 to D4 with a calibration value corresponding to a time difference ($\Delta t1$, $\Delta t2$) of the reference time t1, in which the first voltage V2 reaches the reference voltage Vref, and the time t2, in which the second voltage V2 reaches the reference voltage Vref. Specifically, the calibration value generation circuit 16 includes a first comparator CM1, a second comparator CM2, inverters N1 and N2, a first AND circuit A1, a second AND circuit A2, and the up-down counter BC1. In the present embodiment, the first comparator CM1 and the second comparator CM2 have the same circuit characteristics (offset voltage, delay characteristics, etc.)

The first comparator CM1 has a non-inverting input terminal, which is connected to the first node ND1, and an inverting input terminal, to which the reference voltage Vref is applied. The first comparator CM1 compares the first voltage V1 and the reference voltage Vref. When the first voltage V1 is less than or equal to the reference voltage Vref, the output signal of the first comparator CM1 has a low level. When the first voltage V1 is greater than the reference voltage Vref, the output signal of the first comparator CM1 has a high level.

The second comparator CM2 has a non-inverting input terminal, which is connected to the second node ND2, and an inverting input terminal, to which the reference voltage Vref is applied. The second comparator CM2 compares the second voltage V2 and the reference voltage Vref. When the second voltage V2 is less than or equal to the reference voltage Vref, the output signal of the second comparator CM2 has a low level. When the second voltage V2 is greater than the reference voltage Vref, the output signal of the second comparator CM2 has a high level.

The first comparator CM1 has an output terminal connected to an input terminal of the inverter N1. An output terminal of the inverter N1 is connected to a first input terminal of the first AND circuit A1. The output terminal of the first comparator CM1 is also connected to a first input terminal of the second AND circuit A2.

The second comparator CM2 has an output terminal connected to an input terminal of the inverter N2. An output terminal of the inverter N2 is connected to a second input terminal of the second AND circuit A2. The output terminal of the second comparator CM2 is also connected to a second input terminal of the first AND circuit A1.

The first and second AND circuits A1 and A2 each have two input terminals. The first AND circuit A1 outputs a signal X, and the second AND circuit A2 outputs a signal Y. The signal X output from the first AND circuit A1 has a high level when its two input signals both have a high level. Otherwise, the signal X has a low level. In the same manner, the signal Y output from the second AND circuit A2 has a high level when its two input signals both have a high level. Otherwise, the signal Y has a low level.

The first AND circuit A1 receives the inverted output signal of the first comparator CM1 and the output signal of the second comparator CM2. Thus, the signal X of the first AND circuit A1 has a high level from when the second voltage V2 reaches the reference voltage Vref to when the first voltage V1 reaches the reference voltage Vref.

The second AND circuit A2 receives the output signal of the first comparator CM1 and the inverted output signal of the second comparator CM2. Thus, the signal Y of the second AND circuit A2 has a high level from when the first voltage V1 reaches the reference voltage Vref to when the second voltage V2 becomes equal the reference voltage Vef.

The signal X of the first AND circuit A1 and the signal Y of the second AND circuit A2 are provided to the up-down counter BC1. The up-down counter BC1 is also provided with a pulse signal from the oscillation circuit 11. The up-down counter BC1 stores a predetermined initial count value when calibration starts. The up-down counter BC1 updates the count value when the signals X and Y have high levels and stores the updated count value during and after the calibration period. Specifically, when the input signal X has a high level, the up-down counter BC1 increments the count value by one whenever receiving a pulse signal from the oscillation circuit 11 and updates the stored count value. Further, when the input signal Y has a high level, the up-down counter BC1 decrements the count value by one whenever receiving a pulse signal from the oscillation circuit 11 and updates the stored count value. When the signals X and Y have low levels, the up-down counter BC1 maintains the stored count value. The up-down counter BC1 provides the oscillation circuit 11 with the data signals D0 to D4 in correspondence with the count value.

[Self-Calibration Process]

The self-calibration process of the oscillator 10 will now be discussed with reference to FIGS. 2A, 2B, 3A, and 3B. The timing control unit of the oscillator 10 repeats the charge period and the load/reset period until the calibration period elapses. The up-down counter BC1 stores "0" as the initial count value.

[Processing in Charge Period]

The timing control unit stops the reset signal when in the charge period. Subsequently, the capacitor C1 is charged and the first voltage V1 rises (increases monotonously) in accordance with the time constant determined by the resistor R1 and the capacitor C1 of the first voltage supply circuit 13. The second voltage supply circuit 14 repeatedly performs the switching operation in accordance with the frequency f0 of the oscillation circuit 11. Specifically, when the first switching means SW1 is closed and the second switching means SW2 is open, the capacitor C3 is charged and the second voltage V2 is held. When the first switching means SW1 is open and the second switching means SW2 is closed, the capacitor C2 is charged and the second voltage V2 rises. These two operations are repeatedly performed.

When the first voltage V1 does not exceed the reference voltage Vref after the charge period starts, the output of the first comparator CM1 has a low level. When the second voltage V2 does not exceed the reference voltage Vref, the output of the second comparator CM2 has a low level. Thus, the signal X of the first AND circuit A1 and the signal Y of the second AND circuit A2 have low levels, and the up-down counter BC1 maintains the stored count value.

[Second Voltage V2 Reaches Reference Voltage Vref Before First Voltage V1]

Referring to FIG. 2A, calibration of the frequency f0 when the second voltage V2 reaches the reference voltage Vref before the first voltage V1 will now be described. When the second voltage V2 exceeds the reference voltage Vref, the output of the second comparator CM2 shifts to a high level. In this case, the output of the first comparator CM1 maintains a low level since the first voltage V1 has not exceeded the reference voltage Vref.

Figure 2B:
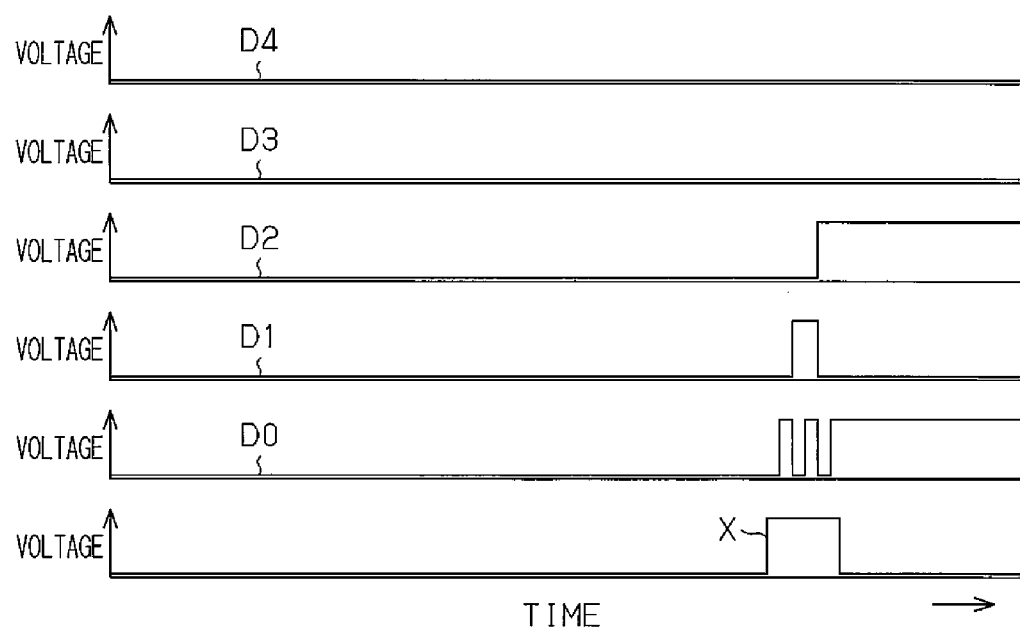
FIG. 2B is a timing chart showing the output signals of data lines.

Thus, each input terminal of the first AND circuit A1 receives a signal having a high level and thereby shifts the signal X of the first AND circuit A1 to a high level. Further, each input terminal of the second AND circuit A2 receives a signal having a low level and thereby shifts the signal Y of the second AND circuit A2 to a low level. Accordingly, the high level signal X and the low level signal Y are input to the up-down counter BC1. Whenever a pulse signal is provided from the oscillation circuit 11 when the signal X has a high level, the up-down counter BC1 increments the count value by one and records the updated count value. The up-down counter BC1 generates the data signals D0 to D4 in correspondence with the updated count value. FIG. 2B shows changes in the data signals D0 to D4 when gradually increasing the count value in accordance with the frequency f0.

When the first voltage V1 exceeds the reference voltage Vref, the output of the first comparator CM1 shifts to a high level. Accordingly, the first AND circuit A1 is provided with a low level signal and a high level signal. This shifts the signal X changes from a high level to a low level. The second AND circuit A2 is provided with a low level signal and a high level signal. This maintains the signal Y at a low level. Accordingly, the up-down counter BC1 stops increasing the count value and maintains the stored count value.

[First Voltage V1 Reaches Reference Voltage Vref Before Second Voltage V2]

Referring to FIG. 3A, calibration of the frequency f0 when the second voltage V2 reaches the reference voltage Vref after the first voltage V1 will now be described. When the first voltage V1 exceeds the reference voltage Vref, the output of the first comparator CM1 shifts to a high level. In this case, the output of the second comparator CM2 maintains a low level since the second voltage V2 has not exceeded the reference voltage Vref.

Figure 3B:
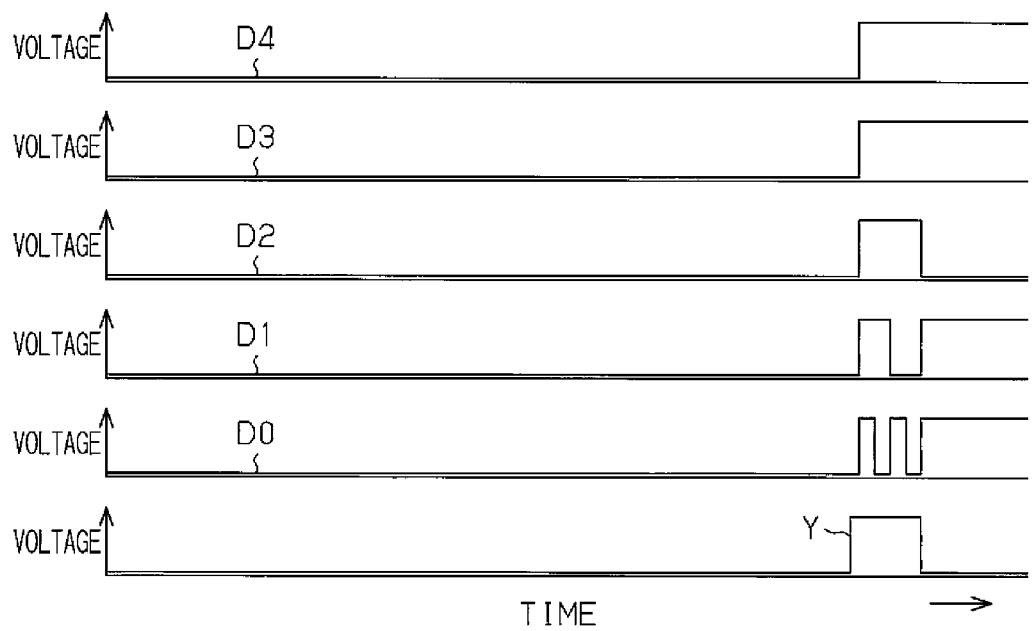
FIG. 3B is a timing chart showing the output signals of the data lines.

Thus, each input terminal of the second AND circuit A2 receives a signal having a high level and thereby shifts the signal Y of the second AND circuit A2 to a high level. Further, each input terminal of the first AND circuit A1 receives a signal having a low level and thereby shifts the signal X of the first AND circuit A1 to a low level. Accordingly, the low level signal X and the high level signal Y are input to the up-down counter BC1. Whenever a pulse signal is provided from the oscillation circuit 11 when the signal Y has a high level, the up-down counter BC1 decrements the count value by one and records the updated count value. The up-down counter BC1 provides a negative value to the oscillation circuit 11 when the count value is decreased from the initial value "0". The up-down counter BC1 generates the data signals D0 to D4 in correspondence with the updated count value. FIG. 3B shows changes in the data signals D0 to D4 when gradually decreasing the count value in accordance with the frequency f0.

When the second voltage V2 exceeds the reference voltage Vref, the output of the second comparator CM2 shifts to a high level. Accordingly, the second AND circuit A2 is provided with a low level signal and a high level signal. This shifts the signal Y from a high level to a low level. The low level signal and the high level signal are provided to the first AND circuit A1, and the signal X maintains a low level. Accordingly, the up-down counter BC1 maintains the stored count value.

[Load/Reset Period]

When the charge period ends, that is, when the load/reset period starts, the timing control unit provides the load signal LS1 to the up-down counter BC1. When receiving the load signal LS1, the up-down counter BC1 provides the oscillation circuit 11 with the data signals D0 to D4, which are in correspondence with the stored count value. The oscillation circuit 11 calibrates the frequency f0 of the output signal in accordance with the calibration value of the data signals D0 to D4.

When the second voltage V2 reaches the reference voltage Vref before the first voltage V1 advanced by time Δt1, the up-down counter BC1 provides the oscillation circuit 11 with a calibration value corresponding to the count value increased during the time Δt1. The oscillation circuit 11 performs a calibration that decreases the frequency f0 in accordance with the acquired calibration value.

When the second voltage V2 reaches the reference voltage Vref after the first voltage V1 delayed by time Δt2, the up-down counter BC1 provides the oscillation circuit 11 with a calibration value corresponding to the calibration value decreased during the time Δt2. The oscillation circuit 11 performs a calibration that increases the frequency f0 in accordance with the acquired calibration value.

When the first voltage V1 reaches the reference voltage Vref at substantially the same time as the second voltage V2, the up-down counter BC1 provides the oscillation circuit 11 with a calibration value corresponding to the count value for the preceding load signal LS1. The oscillation circuit 11 outputs an output signal having the same frequency f0.

The timing control unit then provides the reset signal to the reset circuit 15. The reset circuit 15 that receives the reset signal resets the potentials at the first node ND1 and the second node ND2 to the voltage at the low potential line. The load/reset period ends when the reset period elapses.

[Error in Frequency f0]

An error in the calibrated frequency f0 of the oscillator 10 will now be described. The oscillator 10 of the present embodiment calibrates the frequency f0. Thus, the time t2 in which the second voltage V2 reaches the reference voltage Vref should be the same as the reference time t1 when the calibration period ends. Accordingly, the equation shown below is satisfied.

$$[C2]/([C3] \times f0) = [C1] \times [R1]$$

In the equation, [C1], [C2], [C3] respectively represent the capacitances of the capacitors C1, C2, and C3. Further, [R1] represents the resistance of the resistor R1. The frequency f0 subsequent to calibration may be expressed by the equation shown below.

$$f0 = [C2]/([C1] \times [C3] \times [R1]) \quad (1)$$

An error in the frequency for this process is in accordance with the number of counts required for the second voltage V2 to reach the reference voltage Vref from the initial value. When reaching the reference voltage Vref with the frequencies for N times, t2=N/f0 is obtained.

When the first voltage V1 and the second voltage V2 reach the reference voltage Vref within one frequency, the up-down counter BC1 neither increments nor decrements the count value and maintains the stored count value. Thus, the time t2 actually includes an error of (N−1)/f1 to (N+1)/f2 with respect to the reference time t1, which is the target time. Here, f1 represents the lowest frequency in the tolerable range of the frequency f0, and f2 represents the highest frequency in the tolerable range of the frequency f0. Accordingly, the frequencies f1 and f2 are expressed by the following equations.

$$N/f0 = (N-1)/f1 \rightarrow f1 = (N-1)/N \times f0 \quad (2)$$

$$N/f0 = (N+1)/f2 \rightarrow f2 = (N+1)/N \times f0 \quad (3)$$

Accordingly, "N" is increased to obtain the frequency f0 with high accuracy. To increase "N", a high reference voltage Vref is set or the ratio ([C2]/[C3]) of the capacitances is increased. In other words, to reduce the error in the calibrated frequency f0, the reference voltage Vref is set to be high in the potential range of the first voltage V1 and the second voltage V2 during the charge period or the ratio ([C2]/[C3]) of the capacitances of the capacitors C2 and C3 is increased.

The present embodiment has the following advantages.

(1) In the present embodiment, the first voltage supply circuit 13, which includes the resistor R1 and the capacitor C1, raises the first voltage V1 at the first node ND1. The resistance [R1] of the resistor R1 and the capacitance [C1] of the capacitor C1 are set to obtain a time constant that allows for the first voltage V1 to reach the reference voltage Vref in the predetermined reference time t1. The second voltage supply circuit 14, which includes the first and second switching means SW1 and SW2 that perform switching with the pulse signals S1 and S2 corresponding to the frequency of the output signal of the oscillation circuit 11, raises the second voltage V2 at the second node ND2. The calibration value generation circuit 16 provides the oscillation circuit 11 with the calibration value corresponding to the time difference (Δt1 and Δt2) between the reference time t1 in which the first voltage V1 reaches the reference voltage Vref and the time t2 in which the second voltage V2 reaches the reference voltage Vref. The oscillation circuit 11 calibrates the frequency f0 based on the calibration value corresponding to the time difference (Δt1 and Δt2) so that the time t2 in which the second voltage V2 reaches the reference voltage Vref reaches the reference time t1. Accordingly, the oscillator 10 efficiently self-calibrates the frequency f0 without using a charge pump.

(2) In the present embodiment, the calibration value generation circuit 16 includes the first comparator CM1, the second comparator CM2, the inverters N1 and N2, the first AND circuit A1, the second AND circuit A2, and the up-down counter BC1. The first comparator CM1 compares the reference voltage Vref and the first voltage V1. The second comparator CM2 compares the reference voltage Vref and the second voltage V2. The first AND circuit A1 receives the inverted output signal of the first comparator CM1 and the output signal of the second comparator CM2. Thus, the signal X of the first AND circuit A1 has a high level from when the second voltage V2 reaches the reference voltage Vref to when the first voltage V1 reaches the reference voltage Vref. Further, the second AND circuit A2 receives the output signal of the first comparator CM1 and the inverted output signal of the second comparator CM2. Thus, the signal Y of the second AND circuit A2 has a high level from when the first voltage V1 reaches the reference voltage Vref to when the second voltage V2 reaches the reference voltage Vref. When the signal X has a high level, the up-down counter BC1 increments the count value by one and updates the count value for each pulse signal. Further, when the signal Y has a high level, the up-down counter BC1 decrements the count value by one and updates the count value for each pulse signal. The up-down counter BC1 maintains the stored count value when the signals X and Y have a low level. The up-down counter BC1 provides the oscillation circuit 11 with the data signals D0 to D4 in correspondence to the count value. The oscillation circuit 11 calibrates the frequency f0 of the output signal in accordance with the calibration value represented by the data signals D0 to D4. Accordingly, the oscillator 10 self-calibrates the frequency f0 with a simple structure.

(3) In the present embodiment, the number N of frequencies for reaching the reference voltage Vref is increased to obtain the frequency f0 with high accuracy. Accordingly, the accuracy of the frequency f0 is increased by setting a high reference voltage Vref high within a reachable range of the first and second voltage V1 and V2 during the charge period or by increasing the capacitance ratio ([C2]/[C3]) of the capacitors C2 and C3.

(4) In the present embodiment, the timing control unit, which stores the calibration period for calibrating the frequency f0, repeats the charge period and the load/reset period until the calibration period elapses. Accordingly, after the calibration period elapses and the calibration ends, the timing control unit stops providing the signals for calibrating the frequency f0. This reduces power consumption.

(5) In the present embodiment, the reset circuit 15 is connected to the first node ND1 and the second node ND2. When receiving the reset signal from the timing control unit in the load/reset period, the reset circuit 15 resets the first voltage V1 at the first node ND1 and the second voltage V2 at the second node ND2 are shifted to the voltage of the low potential line. Thus, the first voltage V1 and the second voltage V2 are forcibly shifted to the voltage of the low potential line before entering the charge period. Accordingly, the voltage at the start time (change initiation time) of the reference time t1, during which the first voltage V1 reaches the reference voltage Vref, is the same as the voltage at the start time (change initiation time) of the time t2, during which the second voltage V2 reaches the reference voltage Vref. This allows for the time difference between the time t2 and the reference time t1 to be detected with further accuracy.

Second Embodiment

A second embodiment of the present invention will now be discussed with reference to FIGS. 4 and 5. In the present embodiment, like or same reference numerals are given to those components that are the same as the corresponding components of the first embodiment. Such components will not be described in detail.

Figure 4:
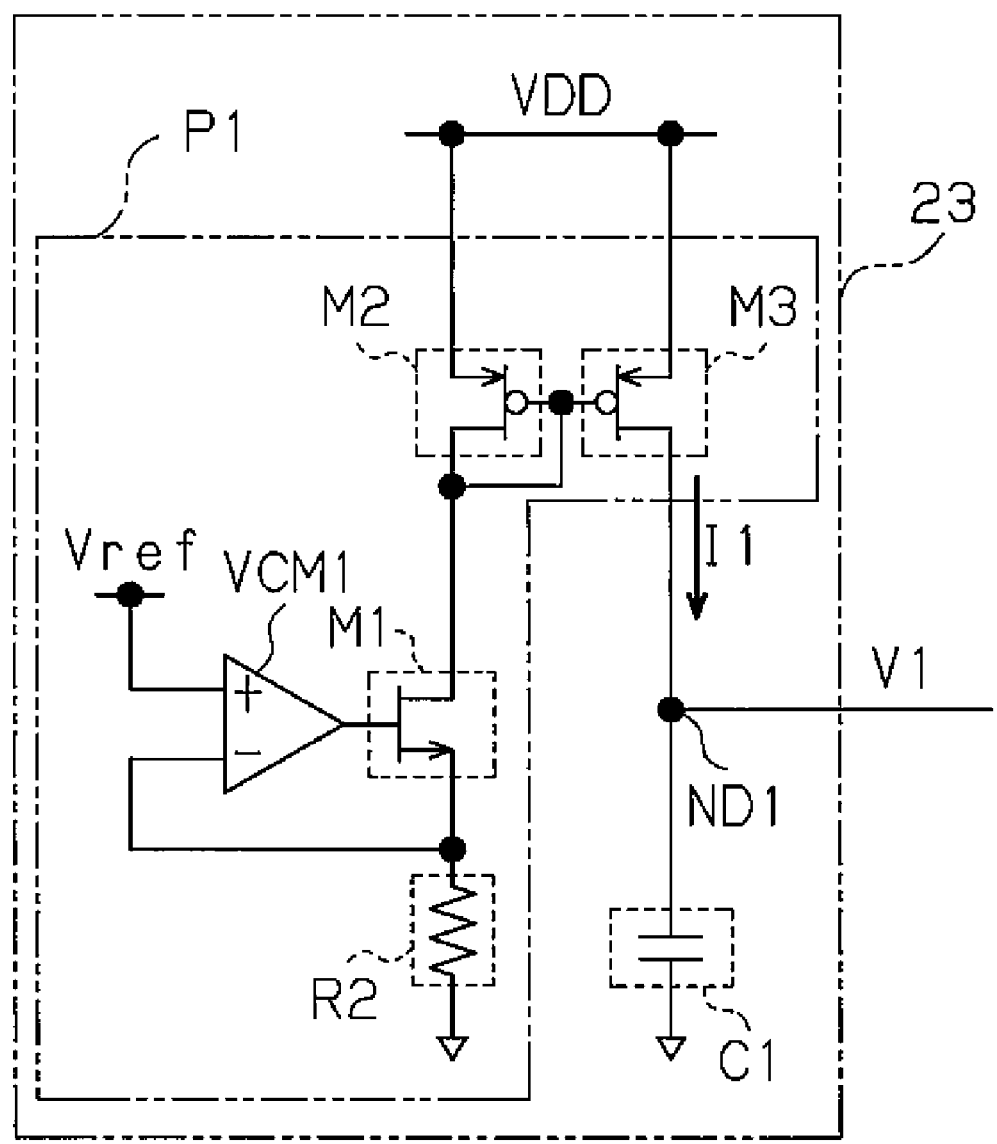
FIG. 4 is a schematic circuit diagram of a self-calibrating oscillator according to a second embodiment of the present invention.

In the present embodiment, a first voltage supply circuit 23 shown in FIG. 4 is used in lieu of the first voltage supply circuit 13 of the first embodiment. The first voltage supply circuit 23 of the present embodiment uses a constant current source P1 in lieu of the resistor R1 of the first voltage supply circuit 13. In other words, the first voltage supply circuit 23 is formed by connecting the constant current source P1 and the capacitor C1 in series.

The constant current source P1 supplies constant current I1 to the capacitor C1. The constant current source P1 includes a comparator VCM1, a resistor R2, and transistors M1, M2, and M3. The transistor M1 is an N-channel MOS transistor, and the transistors M2 and M3 are P-channel MOS transistors.

The reference voltage Vref is applied to the non-inverting input terminal of the comparator VCM1. The inverting input terminal of the comparator VCM1 is connected to the source terminal of the transistor M1. The output terminal of the comparator VCM1 is connected to the gate terminal of the transistor M1.

The source terminal of the transistor M1 is connected to the low potential line through the resistor R2. The drain terminal of the transistor M1 is connected to the high potential line via the transistor M2. Thus, when the current flowing through the transistors M2 and M1 and the resistor R2 is about to change, the comparator VCM1 controls the voltage at the gate terminal of the transistor M1 so that the current flowing through the transistors M2 and M1 and the resistor R2 is kept constant.

Further, the transistors M2 and M3 form a current mirror circuit. Specifically, the source terminals of the transistors M2 and M3 are connected to the high potential line. The gate terminals of the transistors M2 and M3 are connected to the drain terminal of the transistor M2. The drain terminal of the transistor M3 is connected to the capacitor C1. A first node ND1 connecting the transistor M3 and the capacitor C1 serves as a first connection node in the present embodiment. Thus, the constant current source P1 supplies the capacitor C1 with current I1 in proportion to the current flowing through the transistor M2. In the present embodiment, due to the current supply from the constant current source P1, the capacitor C1 is charged in proportion to time, and the first voltage V1 at the first node ND1 increases in proportion to time.

Additionally, the calibration value generation circuit 16 of the present embodiment uses the first and second comparators CM1 and CM2 that have the same circuit characteristics in the same manner as the above-described embodiment. However, the present embodiment differs from the first embodiment in that the first and second comparators CM1 and CM2 include a delay that cannot be ignored in the self-calibration process. More specifically, as shown in FIG. 5, after the first voltage V1 reaches the reference voltage Vref and a delay time Tos1 elapses, the first comparator CM1 outputs a signal having a high level. Further, after the second voltage V2 reaches the reference voltage Vref and a delay time Tos2 elapses, the second comparator CM2 outputs a signal having a high level.

[Self-Calibration Process]

The self-calibration process of the present embodiment will now be described. In the same manner as the first embodiment, until the calibration period elapses, the timing control unit of the present embodiment repeatedly enters the charge period and the load/reset period and repeatedly provides the load signal LS1 and the reset signal. In FIG. 5, reference character TC1 denotes the charge period, and reference character TL1 denotes the load/reset period.

In the same manner as the first embodiment, in the present embodiment, during the charge period TC1, the capacitor C1 of the first voltage supply circuit 13 is charged to raise the first voltage V1, and the capacitor C2 of the second voltage supply circuit 14 is charged to raise the second voltage V2. Thus, the first voltage V1 is charged in proportion to time in the present embodiment.

[Second voltage V2 Reaches Reference Voltage Vref Before First Voltage V1]

Figure 5A:
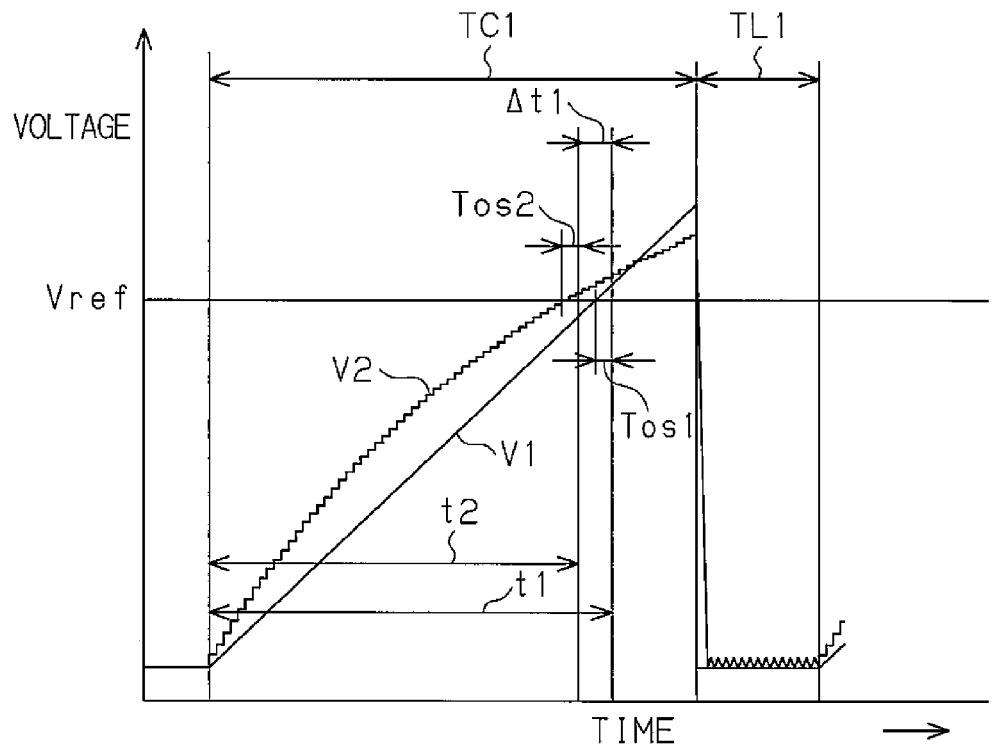
FIG. 5A is a graph showing the relationship between first and second voltages when the second voltage reaches a reference value before the first voltage, for the circuit of FIG. 4.

As shown in FIG. 5A, when the second voltage V2 first reaches the reference voltage Vref, the output of the second comparator CM2 shifts to a high level before the output of the first comparator CM1 in the same manner as in the first embodiment. In this case, when the delay time Tos2 elapses after the second voltage V2 reaches the reference voltage Vref, the second comparator CM2 outputs a signal having a high level. Subsequently, the signal X of the first AND circuit A1 shifts to a high level, and the up-down counter BC1 increases the stored count value whenever provided with the pulse signal.

Then, when the delay time Tos1 elapses after the first voltage V1 reaches the reference voltage Vref, the output of the first comparator CM1 shifts to a high level. In this case, the signal X of the first AND circuit A1 shifts to a low level. Thus, the up-down counter BC1 maintains the stored count value and does not increase the count value even when provided with the pulse signal.

The timing control unit then provides the load signal LS1 to the up-down counter BC1 when the load/reset period starts. When receiving the load signal LS1, the up-down counter BC1 provides the oscillation circuit 11 with the data signals D0 to D4 corresponding to the stored count value. The oscillation circuit 11 calibrates the frequency f0 of the output signal in accordance with the calibration values of the data signals D0 to D4.

Accordingly, in the present embodiment, when the second voltage V2 reaches the reference voltage Vref before the first voltage V1, the up-down counter BC1 provides the oscillation circuit 11 with the count value that is increased during the time $\Delta t1$, from when the second voltage V2 reaches the reference voltage Vref to when the first voltage V1 reaches the reference voltage Vref, in the same manner as the first embodiment. Thus, the oscillation circuit 11 performs calibration for lowering the frequency f0 of the output signal.

[First Voltage V1 Reaches Reference Voltage Vref Before Second Voltage V2]

When the first voltage V1 reaches the reference voltage Vref before the second voltage V2, the output of the first comparator CM1 shifts to a high level before the output of the second comparator CM2 in the same manner as the first embodiment.

In this case, when the delay time Tos2 elapses after the first voltage V1 reaches the reference voltage Vref, the first comparator CM1 outputs a signal having a high level. Subsequently, the signal Y of the second AND circuit A2 shifts to a high level, and the up-down counter BC1 decreases the stored count value whenever provided with the pulse signal.

Then, when the delay time Tos2 elapses after the second voltage V2 reaches the reference voltage Vref, the output of the second comparator CM2 shifts to a high level. In this case, the signal Y of the second AND circuit A2 shifts to a low level. Thus, the up-down counter BC1 maintains the stored count value and does not increase the count value even when provided with the pulse signal.

The timing control unit then provides the load signal LS1 to the up-down counter BC1 when the load/reset period starts. When receiving the load signal LS1, the up-down counter BC1 provides the oscillation circuit 11 with the data signals D0 to D4 corresponding to the stored count value. The oscillation circuit 11 calibrates the frequency f0 of the output signal in accordance with the calibration values of the data signals D0 to D4.

Accordingly, in the present embodiment, when the first voltage V1 reaches the reference voltage Vref before the second voltage V2, the up-down counter BC1 provides the oscillation circuit 11 with the count value that is decreased from when the first voltage V1 reaches the reference voltage Vref to when the second voltage V2 reaches the reference voltage Vref, in the same manner as the first embodiment. Thus, the oscillation circuit 11 performs calibration for lowering the frequency f0 of the output signal.

Figure 5B:
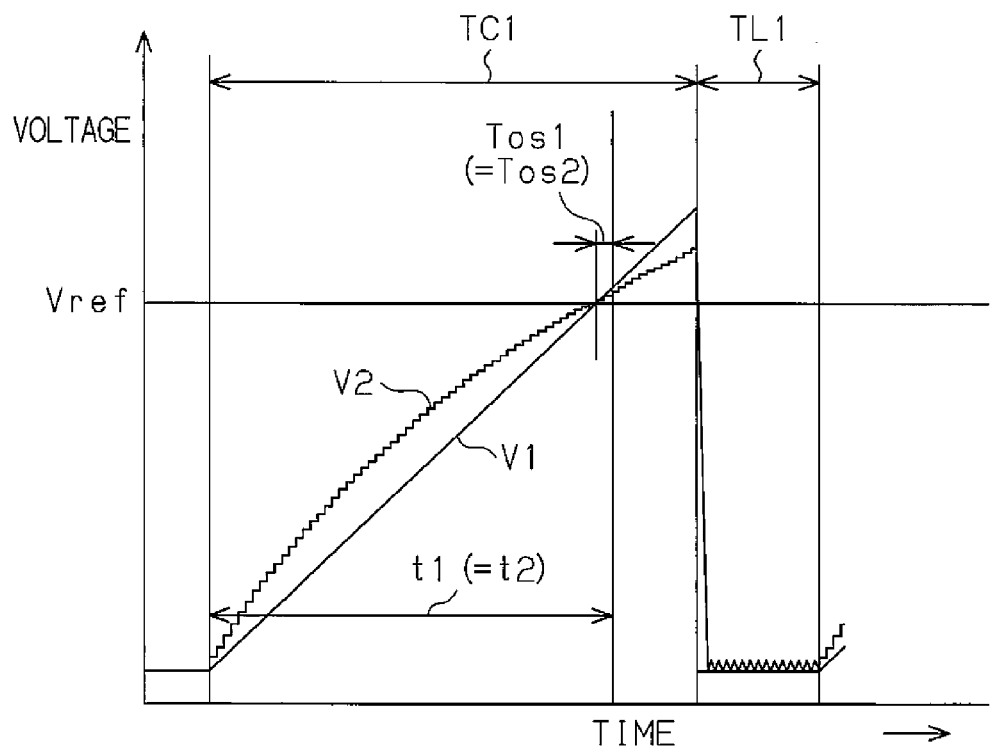
FIG. 5B is a graph showing the relationship between the first and second voltages when the second voltage reaches the reference value at the same time as the first voltage when the frequency is self-calibrated.

Subsequently, when the oscillation circuit 11 calibrates the frequency f0 of the output signal in accordance with the calibration value, the time t2 becomes the same as the reference time t1, as shown in FIG. 5B.

The present embodiment has the advantages described below in addition to advantages (1) to (5).

(6) The first voltage supply circuit 23 of the present embodiment includes the constant current source P1 and the capacitor C1. Due to the use of the constant current source P1, the first voltage V1 rises in proportion to time. Thus the, the increasing rate of the first voltage V1 does not decrease as time elapses. Accordingly, the reference time t1 is further accurately adjusted by determining the reference voltage Vref, and the frequency f0 of the output signal is further accurately calibrated.

(7) In the present embodiment, the calibration value generation circuit 16 includes the first comparator CM1 and the second comparator CM2, which have the same circuit characteristics. Thus, the time difference between the reference time t1 and the time t2 is further accurately detected even when the first comparator CM1 and the second comparator CM2 include a delay that cannot be ignored due to offset and delay characteristics. This provides the oscillation circuit 11 with a further accurate calibration value.

It should be apparent to those skilled in the art that the present invention may be embodied in many other specific forms without departing from the spirit or scope of the invention. Particularly, it should be understood that the present invention may be embodied in the following forms.

The calibration value generation circuit 16 in each of the embodiments discussed above includes the up-down counter BC1, which increases the count value to lower the frequency f0 and decreases the count value to raise the frequency f0. Further, the calibration value generation circuit 16 includes the first and second comparators CM1 and CM2, the output signals of which shift to a high level when the first voltage and second voltages V1 and V2 reach the reference voltage Vref. Instead, the up-down counter BC1 may decrease the count value to lower the frequency f0 to become low and increase the count value to raise the frequency f0. Further, the output signals of the first and second comparators CM1 and CM2 may shift from a high level to a low level when the first voltage V1 and the second voltage V2 reach the reference voltage Vref. In other words, the calibration value generation circuit 16 may have any structure as long as it provides the oscillation circuit 11 with a calibration value corresponding to the difference ($\Delta t1$, $\Delta t2$) between the time t2, in which the second voltage V2 reaches the reference voltage Vref, and the reference time t1.

The calibration value generation circuit 16 in each of the embodiments described above includes the up-down counter BC1, which decrements or increments the count value in accordance with the pulse signal. Further, the calibration value generation circuit 16 provides the oscillation circuit 11 with the calibration value in correspondence with the incremented or decremented count value. The calibration value generation circuit 16 is not limited in such a manner and may have change the calibration value in accordance with a difference (positive or negative) of the time t2, in which the second voltage V2 becomes greater than or equal to the reference voltage Vref, from the reference time t1. For example, the calibration value generation circuit 16 may change the count value just once during a single charge period. Specifically, an up-down counter that increments or decrements the stored count value by one and updates the new count value when receiving the load signal LS1 may be used. In such a case, the calibration value is adjusted just once in each cycle. However, the up-down counter BC1 does not provide the oscillation circuit 11 with a signal and thus has a simple structure.

In the first embodiment, the first voltage supply circuit 13 includes the resistor R1 and the capacitor C1. In the second embodiment, the first voltage supply circuit 23 includes the constant current source P1 and the capacitor C1. However, the first voltage supply circuits 13 and 23 are not limited to such structures and only need to be circuits that raise the first voltage V1 at a predetermined time constant, which is irrelevant to the frequency of the oscillation circuit 11. In each of the embodiments discussed above, the second voltage supply circuit 14 includes the switched capacitor circuit SC1 and the capacitor C2. The second voltage supply circuit 14 is also not limited to such a structure and only needs to be a circuit that raises the second voltage V2 of which the time t2 changes until the reference voltage Vref in accordance with the frequency f0 of the oscillation circuit 11.

In each of the embodiments discussed above, the comparators having the same circuit characteristics are used as the first comparator CM1 and the second comparator CM2. However, the present invention is not limited in such a manner. When the first comparator and second comparators CM1 and CM2 have different circuit characteristics, the calibration value may be adjusted in accordance with the time difference between the delay time of the first comparator CM1 and the delay time of the second comparator CM2. Specifically, the time difference of the delay time of the first comparator CM1 and the delay time of the second comparator CM2 is calculated. Then, when the count value is increased or decreased in accordance with the signals X and Y, the up-down counter BC1 further increases or decreases the stored count value in accordance with the time difference of the delay time. For example, the first comparator CM1 may switch the output signal with a delay of two pulses from the second comparator CM2. In this case, when the signal X has a high level and increases the count value, the up-down counter BC1 provides the oscillation circuit 11 with a calibration value obtained by subtracting "2" from the count value. When the signal Y has a high level and decreases the count value, the up-down counter BC1 provides the oscillation circuit 11 with a calibration value obtained by adding "2" to the count value. This provides the oscillation circuit 11 with a further accurate calibration value can be provided to even when the first comparator CM1 and the second comparator CM2 have different circuit characteristics.

In each of the embodiments discussed above, the reference voltage Vref is constant, and the frequency f0 is constant subsequent to calibration. However, the present invention is not limited in such a manner, and the reference voltage Vref may be changed in accordance with each situation. For example, the reference voltage Vref may be set to be low when the frequency f0 may have a low accuracy such as in the sleep mode, and the reference voltage Vref may be set to be high when the frequency f0 must have a high accuracy such as in the active mode.

In each of the embodiments discussed above, the first voltage V1 and the second voltage V2 are raised in the charge period. Instead, the first voltage V1 and the second voltage V2 may be lowered. In other words, as long as calibration is in correspondence with the difference (Δt1, Δt2) of the time t2, in which the second voltage V2 reaches the reference voltage Vref, from the reference time t1, the monotonous change of the first voltage V1 may be an increase or a decrease.

The present examples and embodiments are to be considered as illustrative and not restrictive, and the invention is not to be limited to the details given herein, but may be modified within the scope and equivalence of the appended claims.

What is claimed is:

1. A self-calibrating oscillator, comprising:
an oscillation circuit that generates an output signal that corresponds to a calibration value;
a first voltage supply circuit that outputs a first voltage, which is monotonously changed in accordance with a predetermined time constant;
a second voltage supply circuit that outputs a second voltage, wherein the second voltage is changed by a switching operation corresponding to the frequency of the oscillation circuit output signal; and
a calibration value generation circuit that provides the oscillation circuit with the calibration value, wherein the calibration value corresponds to a difference between a time in which the second voltage reaches a reference voltage from a change initiation time and a reference time in which the first voltage reaches the reference voltage from the change initiation time.

2. The self-calibrating oscillator of claim 1, wherein the calibration value generation circuit includes:
a first comparator that compares the first voltage with the reference voltage and outputs a first notification signal for indicating that the first voltage has reached the reference voltage;
a second comparator that compares the second voltage with the reference voltage and outputs a second notification signal for indicating that the second voltage has reached the reference voltage; and
a calibration up-down counter that receives the first and second notification signals and outputs the calibration value in correspondence with a stored count value;
wherein when the first notification signal is received before the second notification signal is received, the calibration up-down counter continuously increments or decrements and updates the count value upon receipt of a pulse signal from the oscillation circuit to increase the frequency until receipt of the second notification signal; and
when the second notification signal is received before the first notification signal is received, the calibration up-down counter continuously increments or decrements and updates the count value upon receipt of the pulse signal from the oscillation circuit and stores the updated count value to decrease the frequency until receipt of the first notification signal.

3. The self-calibrating oscillator of claim 2, wherein the first and second comparators have the same circuit characteristics.

4. The self-calibrating oscillator of claim 1, wherein:
the first voltage supply circuit includes a resistor and a first capacitor connected in series, the resistor and the first capacitor being connected at a first connection node, and the first connection node having the first voltage; and
the second voltage supply circuit includes:
first and second switching means connected in series, the first and second switching means alternately opening and closing in accordance with the frequency of the output signal, the first switching means being connected to a high potential line, and the second switching means being connected to a low potential line via a second capacitor; and
a third capacitor connected in parallel to the second capacitor between the first switching means and the second switching means; and
the second switching means and the second capacitor being connected at a second connection node having the second voltage.

5. The self-calibrating oscillator of claim 4, further comprising:
a reset circuit connected to the first and second connection nodes, wherein the reset circuit sets the first and second voltages to a predetermined initial value before the change initiation time.

* * * * *